(12) United States Patent
Desmarets

(10) Patent No.: US 8,885,341 B2
(45) Date of Patent: Nov. 11, 2014

(54) COMPACT FRONT TO BACK HORIZONTAL COOLING FOR RACK MOUNTED CHASSIS

(75) Inventor: Guillaume F. Desmarets, Lomme (FR)

(73) Assignee: Motorola Mobility LLC, Chicago, IL (US)

( * ) Notice: Subject to any disclaimer, the term of this patent is extended or adjusted under 35 U.S.C. 154(b) by 291 days.

(21) Appl. No.: 13/596,102

(22) Filed: Aug. 28, 2012

(65) Prior Publication Data

US 2014/0063737 A1    Mar. 6, 2014

(51) Int. Cl.
*H05K 7/20*    (2006.01)

(52) U.S. Cl.
USPC ........... 361/696; 361/689; 361/690; 361/692; 361/695; 165/80.3

(58) Field of Classification Search
None
See application file for complete search history.

(56) References Cited

U.S. PATENT DOCUMENTS

| | | | |
|---|---|---|---|
| 7,085,133 B2 * | 8/2006 | Hall | 361/695 |
| 7,248,472 B2 * | 7/2007 | Vinson et al. | 361/694 |
| 7,382,613 B2 * | 6/2008 | Vinson et al. | 361/679.48 |
| 7,430,117 B2 * | 9/2008 | Shabany | 361/695 |
| 7,813,120 B2 * | 10/2010 | Vinson et al. | 361/679.5 |
| 7,826,216 B2 * | 11/2010 | Moss | 361/679.49 |
| 7,857,688 B1 * | 12/2010 | Cunningham et al. | 454/184 |
| 8,064,200 B1 | 11/2011 | West et al. | |
| 8,087,979 B2 | 1/2012 | Rasmussen | |
| 8,259,449 B2 * | 9/2012 | Novotny et al. | 361/696 |
| 2005/0099772 A1 * | 5/2005 | Wei | 361/695 |
| 2010/0091458 A1 * | 4/2010 | Mosier et al. | 361/695 |
| 2011/0011562 A1 | 1/2011 | Aybay et al. | |

OTHER PUBLICATIONS

APC Rack Side Air Distribution 115V 60HZ Fan unit, http://www.google.com/products/catalog?pq=electronic+rack=coo . . . , downloaded from Internet: Jan. 23, 2012,one page.
CyberONE: Vertical Floor Mounted Precision Air Coolers, Engineering Manual, From 2 to 10 Tons (60 Hz Data), SATS, The Natural Alternative, Stulz Air Technology Systems, Inc., copyright Jul. 2005—Form L-03-C-103, all pages.

* cited by examiner

*Primary Examiner* — Boris Chervinsky
(74) *Attorney, Agent, or Firm* — Fish & Richardson P.C.

(57) ABSTRACT

An improved electronic communications system and process 100 with front to back cooling can be provided in which the flow of influent cooling air can be directed horizontally through an intake cooling plenum chamber 145-146 positioned above or below line cards 127-129 and then passed downwardly through an inlet side cooling plenum 139-141. The cooling air can thereafter be propelled sideways, laterally and horizontally across passageways 138 between the line cards to remove heat generated by the line cards. The effluent heated air can be passed upwardly through an outlet side cooling plenum 142-144 and can be discharged through an exhaust cooling plenum to chamber 147-148 which can be diagonally separated from the intake cooling plenum chamber 145-146 by a fluid-impermeable plate 149-151.

20 Claims, 6 Drawing Sheets

CHASSIS DEEP FAN TRAY

TOP VIEW

COMPACT FRONT TO BACK HORIZONTAL COOLING FOR RACK MOUNTED CHASSIS

BACKGROUND OF THE INVENTION

1. Field of the Disclosure

The disclosure relates in general to electronic communications equipment and, more particularly, to cooling electronic communications equipment.

2. Background Art

Electronic components depend on the passage of electric current to perform their intended function and they become potential sites for excessive heating, since the current flow through a resistance is accompanied by heat generation. Continued miniaturization of electronic systems has resulted in a dramatic increase in the amount of heat generated per unit volume. Unless properly designed and controlled, high rates of heat generation results in high operating temperatures for electronic equipment, which jeopardizes the safety and reliability of the electronic equipment. The failure rate of electronic equipment increases exponentially with temperature. Also, the high thermal stresses in the solder joints of electronic components mounted on circuit boards resulting from temperature variations are major causes of failure. Therefore, thermal control has become increasingly important in the design and operation of electronic equipment.

Heat is generated in a resistive element for as long as current continues to flow through it. This creates a heat build-up and a subsequent temperature rise at and around the electronic component. The temperature of the electronic component will continue rising until the electronic component fails unless heat is transferred away from it. The temperature of the component will remain constant; when the rate of heat removal from it equals the rate of heat generation. Electronic components fail under prolonged use at high temperatures. The cooler the electronic device operates, the more reliable it is. A rule of thumb is that the failure rate of electronic components is halved for each 10° C. reduction in their junction temperature.

The electronic communications device, equipment, system and process which are the subject of this invention can be used by telecommunication companies or in data centers, which usually mount in 19 inch or 23 inch wide racks. Due to typical rack mount installations, system operators often require rack mounted chassis to adopt a cooling air flow which, inputs fresh air from the front of the system and exhausts warm air out the back. Front to back cooling either requires a vertical room or changing the chassis boards form factor. In the past, such front to back air flow has not been as efficient and effective as is desired with horizontal boards, wide boards, front face plates, back face plates, limited system height, backplanes, midplanes, high power requirements and limited budgets. Furthermore, front to back cooling often takes place in a room with a rack mounted chassis and is difficult to combine with "pizza box" chassis.

Over the years, numerous cooling systems techniques have been used in electronic equipment such as conduction cooling, natural convection, radiation cooling, forced-air cooling, liquid cooling, and immersion cooling.

It is, therefore, desirable to provide an improved electronic communications cooling system and process, which overcomes most if not all of the preceding disadvantages.

SUMMARY OF THE INVENTION

An improved electronic communications cooling system and process is provided which is especially useful for rack-mountable electronic communications devices, such as: a digital television broadcast (DTB) infrastructure modules, digital video transmitters, digital video receivers, digital video transceivers, digital video streaming devices, telecommunications devices, network infrastructure equipment, such as network routers, switches, etc., or combinations of any of the preceding. Advantageously, the improved electronic communications cooling system and process is compact, economical and efficient. Desirably, the improved electronic communications cooling system and process can provide effective front to back cooling.

In one aspect, the improved electronic communications cooling system and process combines the cooling intake and exhaust plenums and fans in the same horizontal space, such as by splitting the chassis in two, such as diagonally. The cooling fan plenums can provide more flexibility for selection of fans, such as type, number, size, style, etc. Because the plenums required on the tell and right of the boards to cool are of very limited or relatively small size, wider line cards or wider printed circuit boards can be used.

In the illustrative embodiment, the electronic communications cooling system and process, the electronic, communications device and module has front to back cooling; the chassis is split in two sections to provide a plenum cage with dual plenum chambers and a card cage is provided for dual-in-line cards. The cards can mate with a backplane in the center of the chassis. The cards can be hot make-break from front and rear. The card cage can have side vents to allow for crosswise air flow. The plenum cage can be diagonally split into two sections to direct inlet and exhaust. The chassis can have side plenums as well as guide vanes to assist and direct air flow. Fan modules can be located on the front, back and/or sides of the chassis such that the fan modules are positioned in the inlet plenum, exhaust plenum or both.

The inventive electronic communications cooling system and process can be useful for various digital video platforms, controller boxes and numerous electronic infrastructure equipment. The improved electronic communications cooling system and process provides a novel system and method to architect the controller plenum at the module level without taking up valuable space which could otherwise be used for the electronics. The rack mountable air flow distribution of the improved electronic communications cooling system and process can also provide more space and cooling efficiencies.

The improved electronic, communications cooling system can comprise an electronic communications device providing an electronic communications module having a chassis with sides extending between and connecting the front and back. The improved electronic communications cooling system can contain a stack of line cards comprising printed circuit boards which are spaced from each other to form passageways therebetween. Advantageously, an inlet side cooling plenum is positioned adjacent one side of the line cards for passing influent cooling air to the passageways between the line cards and an outlet side cooling plenum is positioned adjacent another side of the line cards for receiving and passing effluent heated air from the passageways between the line cards. Dual plenum chambers can be located above the line cards and separated by a fluid impermeable plate to provide an intake cooling chamber and an exhaust cooling chamber. At least one fan module can be provided for circulating air in the electronic communications module in a front to back flow pattern. Desirably, the fan module cooperates with the cooling chambers, plenums and passageways to cool heat generated by the line cards by directing the flow of influent cooling air through the intake cooling chamber, the inlet side cooling plenum, and the passageways between the line cards and for directing the flow of effluent heated air from the passageways between the line cards through the outlet side cooling, plenum and through the exhaust cooling chamber for front to back cooling of the electronic communications device. The fan module can comprise one or more fan trays, such as chassis deep fan trays, panel fan trays, an intake fan module and/or an exhaust fan module. At least one power supply can be located below the line cards. In the illustrative embodiments, the fluid-impermeable plate can comprises a barrier wall which extends diagonally between and connects the front and back or sides of the chassis or module.

During operation of the electronic communications system and process, heat is generated from a stack of line cards comprising printed circuit boards in the chassis providing a frame of a housing of the electronic communications device. Heat generated from the line cards is emitted into spaces providing printed circuit board (PCB) passageways between the line cards. The electronic communications device can be cooled by circulating air and carrying away the heat in the PCB-passageways. Advantageously, the cooling comprises front to back circulation of air through the chassis of the electronic communications device.

In the electronic communications cooling system and process, the how of influent cooling air can be directed generally horizontally through an intake cooling plenum chamber positioned above the stack of line cards. The influent cooling air can be passed downwardly through an inlet side cooling plenum positioned adjacent one side of the stack of line cards. The influent cooling air can be propelled sideways, laterally and generally horizontally across the PCB-passageways between the line cards to remove and carry away heat generated by the line card. The effluent heated air can be passed from the PCB-passageways positioned adjacent another side of the stack of line cards and generally opposite the inlet side cooling plenum generally upwardly through an outlet side cooling plenum. The effluent heated air can be discharged through an exhaust cooling plenum chamber positioned above the stack of hue cards and separated from the intake cooling plenum chamber by a fluid-impermeable plate. The flow of influent cooling air can be deflected by the inlet deflecting surface of the fluid-impermeable plate in the intake cooling plenum chamber. The flow of effluent heated air can be deflected by the outlet deflection surface fluid-impermeable plate in the exhaust cooling plenum chamber.

The air can be directed, passed, propelled or discharged by at least one fan module, such as by a fan tray, an intake fan module, an exhaust fan module, a chassis deep fan tray a panel fan tray, or combinations of any of the preceding. The fan module(s) can be at the front, back, or one or both of the sides of the electronic communications device.

The improved electronic communications cooling system and process as set forth in the patent claims provide unexpected surprisingly good results.

A more detailed explanation of the invention is provided in the following detailed descriptions and appended claims taken in conjunction with the accompanying drawings.

DETAILED DESCRIPTION OF THE INVENTION

Figure 1:
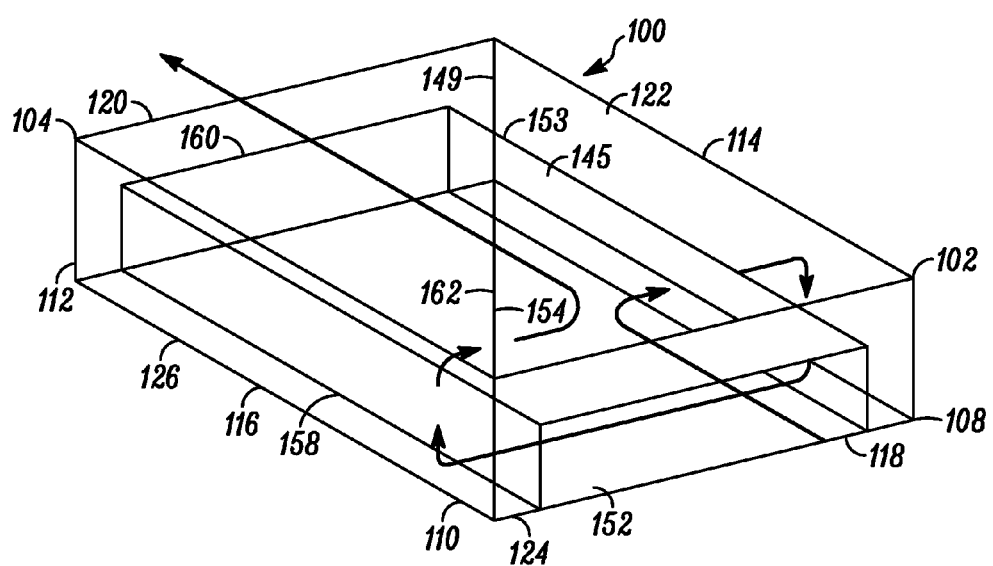
FIG. 1 is a diagrammatic perspective view of an electronic communications cooling system and process with arrows show the flow pattern in accordance with principle of the present invention.

The following is a detailed description and explanation of the preferred embodiments of the invention and best modes for practicing the invention.

FIGS. 1-8 of the drawings illustrates an electronic communications cooling system and process 100 comprising a rack-mounted electronic communications device 102 providing an electronic communications module 104, preferably a digital video streaming device 106 with front to back cooling. The electronic communications cooling system can have a chassis 108 comprising a frame 110 of a housing 112 with elongated substantially parallel longitudinal sides 114 and 116 including a longitudinal intake side 114 and a longitudinal outlet side 116 and lateral substantially parallel transverse sides 118 and 120 extending between and connecting the longitudinal sides. One of the sides can have a face plate 121. A top surface 122 providing a top can extend between and be connected to the longitudinal sides and the lateral sides An underside 124 comprising a bottom surface 126 which provides a bottom can be positioned below and substantially parallel to the top surface and can extend between and be connected to the longitudinal sides and the lateral sides. The chassis frame and housing can have a front 118 comprising the front lateral side and can have a back positioned opposite of the front which can comprises the back lateral side.

Figure 11:
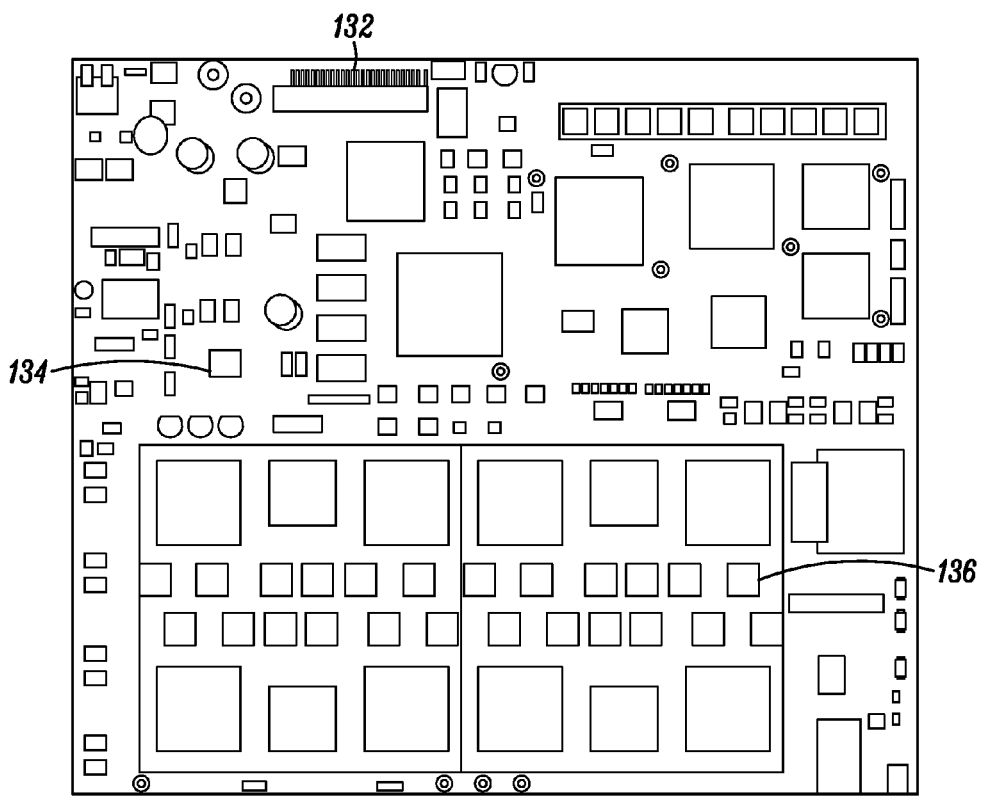
FIG. 11 is a top view of a line card for use in an electronic communications cooling system and process in accordance with principle of the present invention.

One or more upright vertical stacks of horizontally positioned line cards 127-129 (FIGS. 2-4 and 6) can extend longitudinally in the chassis and can be held and received in slots of a card cage 130. Each of the line cards can comprise a printed circuit board (PCB) 132 (FIG. 11) with electronic circuitry 134 and electrical components 136 thereof. The line cards can be vertically spaced from each other to form generally horizontal PCB-passageways therebetween 138. The electrical components and the line cards generate heat in the PCB-passageways.

An inlet upright side cooling plenum 139-141 (FIGS. 2-7) can provide an upright inlet duct section positioned laterally from the line cards and pneumatically communicating with the PCB-passageways for providing inlet cooling pathways for passing influent cooling air downwardly and to the PCB-passageways.

An outlet upright side cooling, plenum 142-144 (FIGS. 2-7) can provide an upright outlet duct section positioned laterally opposite of the inlet duct section and laterally from the line cards and pneumatically communicating with the PCB-passageways for providing an outlet cooling pathway for receiving, heated air from the PCB-passageways and passing the effluent heated air upwardly.

Dual plenum chambers 145-148 (FIGS. 1, 5 and 7) can be located in general horizontal alignment with each other and positioned above the line cards below and in proximity to the top surface of the chassis. In some circumstances, it ma be desirable that the dual plenum chambers be located below the line cards. The dual plenum chambers can be separated and partitioned by a diagonal upright vertical barrier will 149-151 which can provide a fluid-impervious (fluid-impermeable) baffle, deflector, plate and partition. The dual plenum chambers can comprise an intake cooling chamber 145 or 146 providing an inlet compartment and an exhaust cooling chamber 147 or 148 providing an outlet compartment. The intake cooling chamber can have an intake opening and mouth providing an intake port 152 (FIG. 5) positioned in proximity to the front of the chassis for ingress of influent ambient air and can have an exit opening and outlet providing an outlet port 153 (FIG. 7) positioned in proximity to the longitudinal outlet side of the chassis for egress of influent ambient air. The barrier wall can have an upright inlet deflection surface 154 providing an intake vane which faces towards the intake cooling chamber for directing and deflecting the influent ambient air from the intake port to the outlet port.

An input, inlet and intake fan tray 156 or 157 (FIGS. 4-7) providing an intake fan module and assembly can be located above or below the line cards and pneumatically communicate with and be positioned adjacent and in proximity to the intake cooling chamber and the inlet cooling plenum for drawing influent ambient air into the intake port through the intake cooling chamber and injecting and propelling the influent ambient air downwardly through the inlet cooling plenum and generally horizontally through and laterally across the PCB-passageways to the outlet cooking plenum.

The exhaust cooling chamber can have an inlet opening providing an inlet port 158 (FIG. 7) positioned in proximity to the longitudinal outlet side of the chassis for ingress of effluent heated air from the outlet cooling plenum and can have an exhaust opening comprising a discharge vent providing an exhaust port 160 (FIG. 5) positioned in proximity to the back of the chassis. The barrier wall can have an upright outlet deflection surface 162 providing outlet vans which face towards the exhaust cooling chamber for directing and deflecting the effluent heated air from the inlet port to the exhaust port in the exhaust cooling chamber.

An output exhaust fan tray 164 or 165 (FIGS. 5 and 7) providing an exhaust fan module and assembly can be located above or below the line cards and pneumatically communicate with and be positioned adjacent and in proximity to the exhaust cooling chamber and the outlet cooling plenum for drawing effluent heat air from the PCB-passageways and upwardly through the outlet cooling plenum and injecting and propelling the effluent heated air through the exhaust cooling chamber and propelling and exiting the effective heated air through the discharge vent in proximity to the back of the chassis at a temperature greater than the ambient air.

Figure 4:
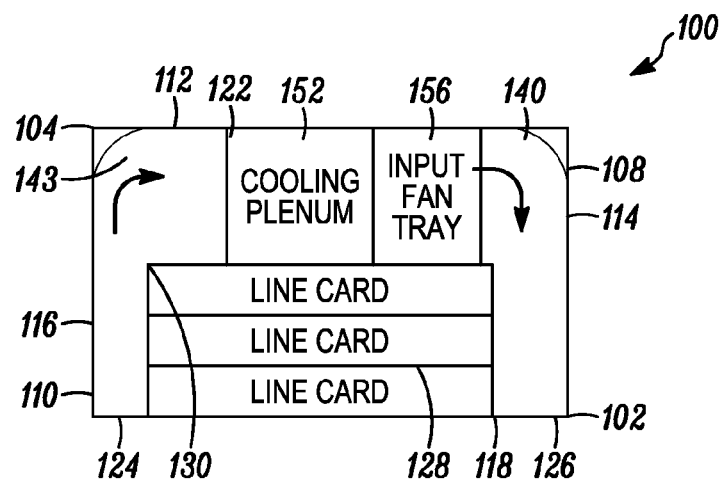
FIG. 4 is a diagrammatic front view of an electronic communications cooling system and process with chassis deep fan trays and with arrows illustrating the flow pattern in accordance with principle of the present invention.
Figure 5:
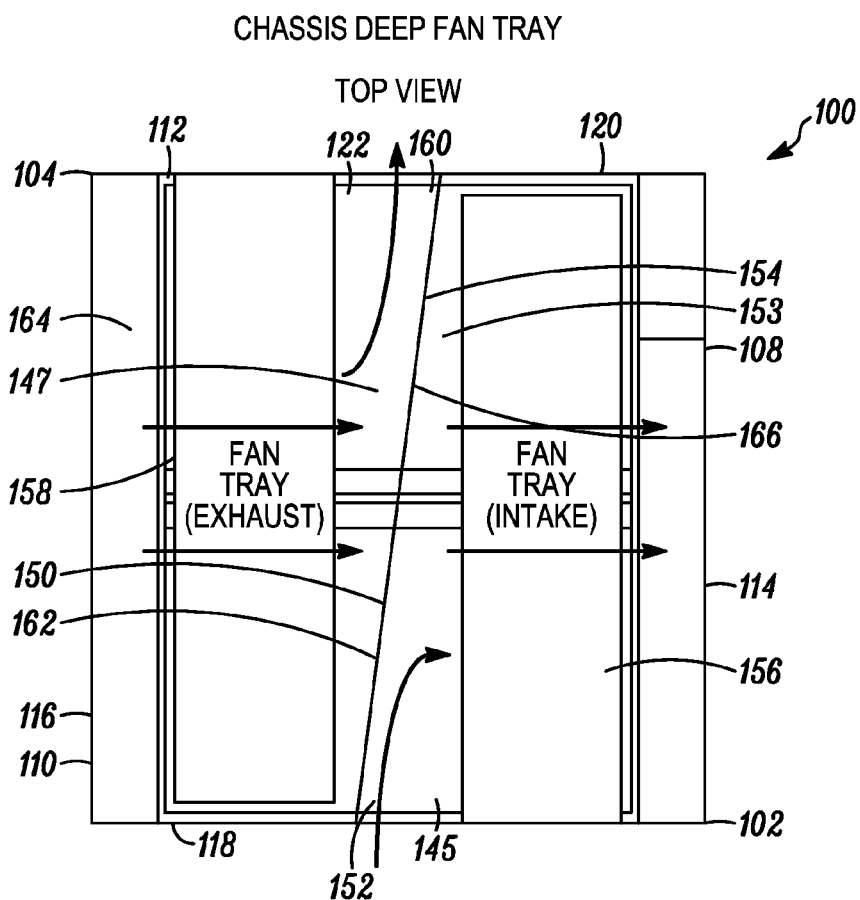
FIG. 5 is a diagrammatic top view of the electronic communications cooling system and process with chassis deep fan trays of FIG. 4 and depicting arrows illustrating the flow pattern.
Figure 10:
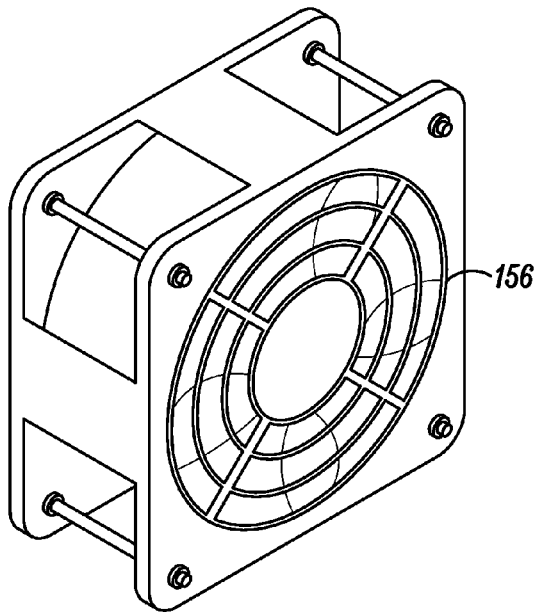
FIG. 10 is an enlarged perspective view of another fan tray that can be used in an electronic communications cooling system and process in accordance with principle of the present invention.

In FIGS. 4 and 5, the fan trays comprise longitudinally-extending chassis deep fan trays 156 and 164 including an input chassis deep fan tray 156 which can extend longitudinally along and in proximity to the longitudinal intake side of the chassis, frame and housing and have an output chassis deep fan tray 164 which can extend longitudinally along and in proximity to the longitudinal outlet side of the chassis, frame and housing. The fan tray can be similar to that shown in FIG. 10. In FIGS. 4 and 5, the intake cooling chamber can comprises a converging generally triangular contraction and compression intake cooling, chamber 145 which can converge towards the back of said chassis, frame and housing as viewed from the top. The exhaust cooling chamber of FIGS. 4 and 5 can comprise a diverging generally triangular expansion exhaust cooling chamber 147 which can diverge toward the back of the chassis, frame and housing as viewed from the top. The barrier wall of FIGS. 4 and 5 can comprise a substantially planar and flat barrier wall 159 which can extend longitudinally and diagonally connect the front and back of the chassis.

Figure 6:
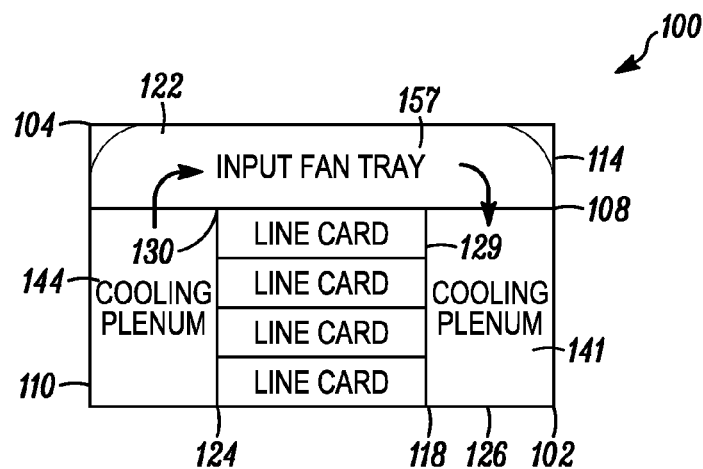
FIG. 6 is a diagrammatic from view of an electronic communications cooling system and process with front panel fan trays and with arrows illustrating the flow pattern in accordance with principle of the present invention.
Figure 7:
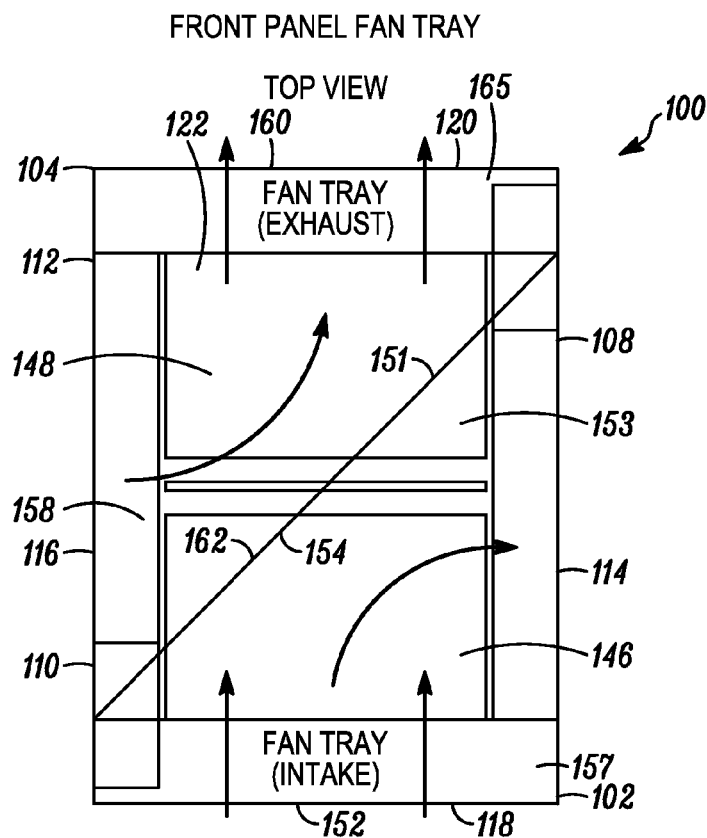
FIG. 7 is a diagrammatic top view of the electronic communications cooling system and process with front panels fan trays of FIG. 6 and depicting arrows illustrating the flow pattern.
Figure 9:
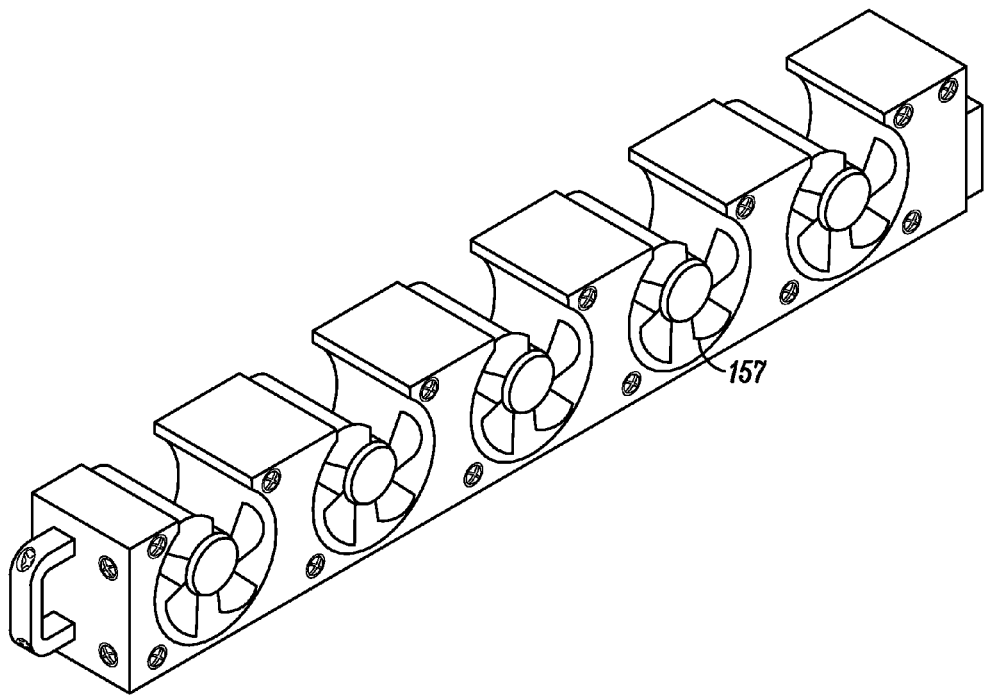
FIG. 9 is an enlarged perspective view of a fan tray that can be used in an electronic communications cooling system and process in accordance with principle of the present invention.

In FIGS. 6 and 7, the fan trays can comprise laterally-extending panel fan trays 157 and 165 including a front panel fan tray 157 which can extend laterally along and in proximity to the front of the chassis, frame and housing and can have a back panel fan tray 165 which can extend laterally along and in proximity to the back of the chassis, frame and housing. The fan tray can be similar to that shown in FIG. 9. In FIGS. 6 and 7, the intake cooling chamber can comprise a generally triangular intake cooling chamber 146 as viewed from the top and the exhaust cooling chamber can comprise a generally triangular exhaust cooling chamber 148 as viewed from the top. The barrier wall 151 of FIGS. 6 and 7 can comprise a substantially planar and flat barrier wall which can extend laterally and diagonally connect the lateral sides of the chassis.

Figure 2:
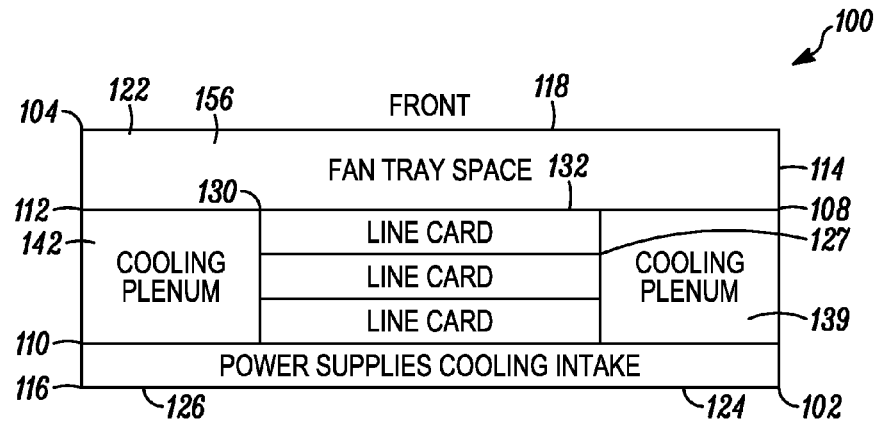
FIG. 2 is a diagrammatic front view of an electronic communications cooling system and process with power supplies in accordance with principle of the present invention.
Figure 3:
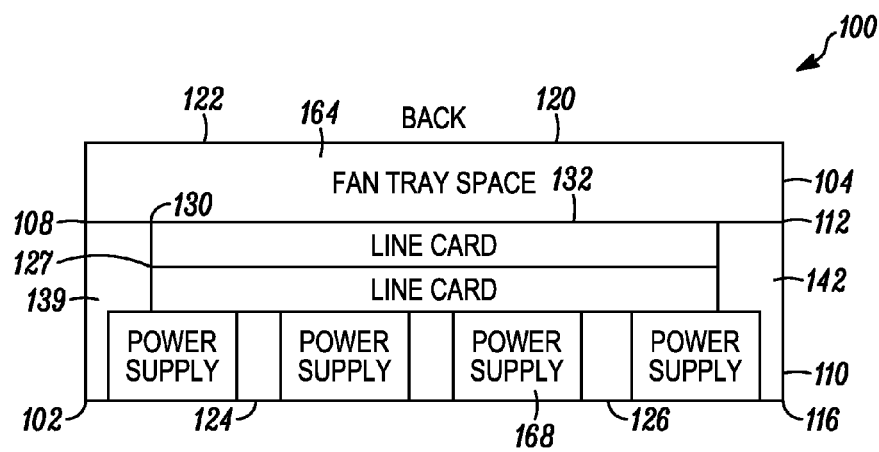
FIG. 3 is a diagrammatic back view of the electronic communications cooling system and process with power supplies of FIG. 2.

As shown in FIG. 1, the harder wall can comprises a backplane or midplane 149. As shown in FIGS. 2 and 3, the line cards 127 can comprise an array of different level dual-in-line cards. Power supplies 168 (FIG. 3) can be located and positioned below or above the line cards in proximity to the bottom of the chassis.

The electronic communications system can comprise a rack-mountable electronic communications device, such as: a digital television broadcast (DTB) infrastructure module, digital video transmitter, digital video receiver, digital video transceiver, digital video streaming device, telecommunications device, network infrastructure equipment, such as but not limited to network routers, switches, etc. or combinations of any of the preceding.

Figure 8:
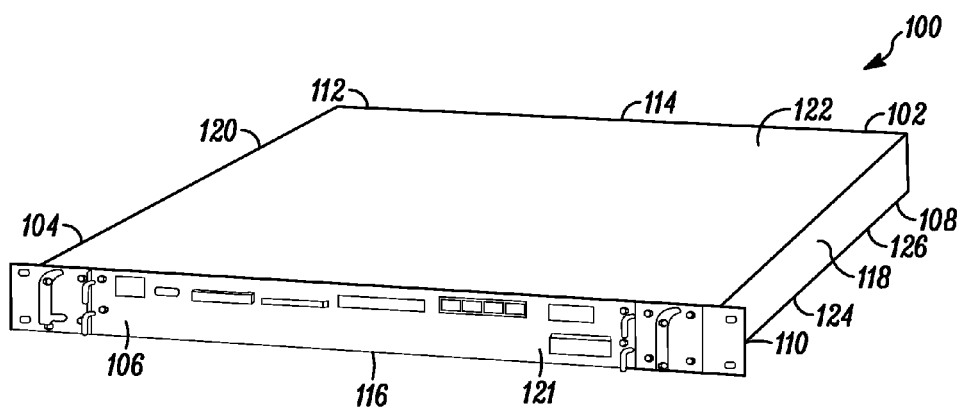
FIG. 8 is a perspective view of an electronic communications cooling system comprising a digital video streaming device with front to back cooling in accordance with principle of the present invention.

The electronic communications system preferably comprises a digital video streaming device with front to back cooling as shown in FIG. 8 and can provide statistical multiplexing, reliability and stability. As operators look to maximize bandwidth usage, deploy additional digital services and drive new revenue streams with advanced advertising solutions, the digital video streaming device with front to back cooling can deliver advertising insertion alongside MPEG-4 and MPEG-2 rate shaping capabilities for both standard definition (SD) and high definition (HD) video, all in a dense single rack unit device. The digital video streaming device and front to back cooling can support hundreds of simultaneous video streams, with near instantaneous failover redundancy capability. The digital video streaming device with front to back cooling can give operators the density, flexibility and high availability they need to maximize bandwidth usage and increase the value of their advertising inventory to target ads. The digital video streaming device with front to back cooling can also provide a highly reliable platform that can grow with customers' needs and provide the ability to scale via software-only upgrades. The digital video streaming device and front to back cooling can further leverage existing infrastructure to support addressable advertising while offering the flexibility of scale for ultra-high density applications.

To maximize flexibility, the digital video streaming device with front to back cooling can include features, such as: session-based encryption, digital watermarking, forward error correction (FEC), motion graphics overlay and video scaling. The digital video streaming device with front to back cooling can comprise an advanced architecture and can provide the power, scalability and reliability required to build high-density digital video solutions for service providers. The digital video streaming device with front to back cooling can enable additional, applications, such as grooming and dejittering and can have the performance needed to support initiatives like switched digital video, video on demand (VOD), playlist advertising, Internet protocol television (IPTV), and bulk encryption. The digital video streaming device with front to back cooling can operate in converging IP networks with carrier-class reliability and can have massive processing power to handle up to 2 Gbps or more of aggregate video stream throughput.

Desirably, the digital video streaming device with front to back cooling can support hundreds of simultaneous video streams with near instantaneous failover redundancy capability. The digital video streaming device with front to back cooling can also provide a highly-programmable device that can support evolving technical standards and emerging application needs through simple software upgrades, allowing customers to realize continuous returns on their initial capital investment.

The digital video streaming device with front to back cooling can provide an operations-friendly design that can ensure the high availability needed for high stream counts with redundant and hot-swappable power supplies, hot-swappable fan trays, with 1:1 and N:1 redundancy, and field-replaceable input/output cards and processing modules, all in a space and power-saving IRU (rack unit) enclosure.

In use and operation of the electronic communications system and process, heat is generated from a stack of line cards comprising printed circuit boards in the chassis providing the frame of the housing of the electronic communications device. Heat generated from the line cards is emitted into spaces providing printed circuit board (PCB) passageway's between the line cards. The electronic communications device can be cooled by circulating air and carrying away the heat in the PCB-passageways. Advantageously, the cooling comprises front to back circulation of air from the front to the back of the chassis of the electronic communications device. In the electronic communications cooling system and process, the flow of influent cooling air can be directed generally horizontally through an intake cooling plenum chamber positioned above the stack of line cards. The influent cooling air can be passed generally downwardly through an inlet side cooling plenum positioned adjacent one side of the stack of line cards. The influent cooling air can be propelled sideways, laterally and generally horizontally across the PCB-passageways between the line cards to remove and carry away heat generated by the line cards. The effluent heated air can be passed from the PCB-passageways positioned adjacent another side of the stack of line cards and generally opposite the inlet side cooling plenum generally upwardly through an outlet side cooling plenum. The effluent heated air can be discharged through an exhaust cooling plenum chamber positioned above the stack of line cards and diagonally separated from the intake cooling plenum chamber by a fluid-impermeable plate. The flow of influent cooling air can be deflected by the inlet deflecting surface of the fluid-impermeable plate in the intake cooling plenum chamber. The flow of effluent heated air can be deflected by the outlet deflection surface of the fluid-impermeable plate in the exhaust cooling plenum chamber.

In the electronic communications system and process, air can be directed, passed, propelled or discharged by one or more fan modules, such as by fan trays, intake fan modules, exhaust fan modules, chassis deep fan trays, panel fan trays, or combinations of any of the preceding. The fan module(s) can be at the front, back, or one or both of the sides of the electronic communications device.

In air cooling by forced convention, convection heat transfer between a solid surface and a fluid (e.g. air or another gas or liquid) is proportional to the velocity of the fluid. The higher the velocity, the larger the now rate and the higher the heat transfer rate. The fluid velocities associated with natural convection currents are naturally low and, therefore, natural convection cooling is limited to low-power electronic systems. By adding one or more fans and blowing air through the chassis and enclosure that houses the electronic components of the digital video streaming device with front to hack cooling, cooling by forced convection is attained in order to enhance the velocity and the flow rate of the fluid as well as the heat transfer rate. By doing so, the heat transfer coefficient can be increased by a factor of up to about 10, depending on the size and number of the fans. Heat can be removed at much higher rates for a specified temperature difference between the components and the air and the surface temperature of the components can be reduced considerably for specified power dissipation. The mass flow rate of air required for cooling a chassis of the digital video streaming device with front to hack cooling depends on the temperature of air available for cooling. In cool environments, such as an air-conditioned room, a smaller flow rate will be adequate. However, in hot environments, a larger flow rate is needed to avoid 70 overheating the components and the potential problems associated with it.

Among the many advantages of the electronic communications cooling system and process are:
1. Superior cooling for electronic communications systems and processes,
2. Outstanding front to back cooling for rack-mountable electronic communications devices.
3. Especially useful for a digital television broadcast (DTB) infrastructure modules, digital video streaming devices, digital video transmitters, digital video receivers, digital video transceivers, and telecommunications devices.
4. Superb performance.
5. Reliable.
6 Compact.
7. User friendly.
8. Easy to operate.
9. Durable.
10. Economical.
11. Attractive
12. Efficient,
13. Effective Although embodiments of the invention have been shown and described, it is to be understood that various modifications, substitutions, and rearrangements of parts, components, and/or process (method) steps, as well as other uses of the electronic communications cooling system and process can be made by those skilled in the art without departing from the novel spirit and scope of this invention.

What is claimed is:

1. An electronic communications cooling system comprising:
   an electronic communications device providing an electronic communications module having a chassis with a front, a back and sides extending between and connecting said front and back;
   a stack of line cards comprising printed circuit boards, said line cards being spaced from each other to form passageways therebetween;
   an inlet side cooling plenum positioned adjacent one side of said line cards for passing influent cooling air to said passageways between said line cards;
   an outlet side cooling plenum positioned adjacent another side of said line cards for receiving and passing effluent heated air from said passageways between said line cards;
   dual plenum chambers positioned above or below said line cards and separated by a fluid impermeable plate, said dual plenum chambers comprising an intake cooling chamber and an exhaust cooling chamber;
   at least one fan module for circulating air in said electronic communications module in a front to back flow pattern; and
   said fan module cooperating with said cooling chambers, plenums, and passageways to cool heat generated by said line card by directing the flow of influent cooling air through said intake cooling chamber, said inlet side cooling plenum, and said passageways between said line cards and for directing the flow of effluent heated air from said passageways between said line cards through said outlet side cooling plenum and through said exhaust cooling chamber for front to back cooling of said electronic communications device.

2. An electronic communications cooling system in accordance with claim 1 wherein said fan module comprises a fan tray.

3. An electronic communications cooling system in accordance with claim 1 wherein said fan module comprises an intake fan module.

4. An electronic communications cooling system in accordance with claim 1 wherein said fan module comprises an exhaust fan module.

5. An electronic communications cooling system in accordance with claim 1 wherein said fan module comprises a chassis deep fan tray.

6. An electronic communications cooling system in accordance with claim 1 wherein said fan module comprises a panel fan tray.

7. An electronic communications cooling system in accordance with claim 1 including at least one power supply positioned below said line cards.

8. An electronic communications cooling system in accordance with claim 1 wherein said plate comprises a barrier wall extending diagonally between and connecting said front and back.

9. An electronic communications cooling system in accordance with claim 1 wherein said plate comprises an upright partition extending diagonally between and connecting said sides.

10. An electronic communications cooling system in accordance with claim 1 wherein said electronics communications device is selected from the group consisting of: an electronic communication module, a rack-mounted electronic communications device, digital television broadcast module, digital video transmitter, digital video receiver, digital video transceiver, digital video streaming device, telecommunications device, network infrastructure equipment, network routers, network switches and combinations of any of the preceding.

11. An electronic communications cooling process, comprising the steps of:
    generating heat from a stack of line cards comprising printed circuit boards in a chassis providing a frame of a housing of an electronic communications device;
    emitting the heat generated from said line cards into spaces providing printed circuit board (PCB) passageways between said line cards;
    cooling said electronic communications device by circulating air and carrying away said heat in the PCB-passageways, said cooling including front to back circulation of air from the front to the back of said chassis of said electronic communications device, said front to back circulation including:
      directing flow of influent cooling air generally horizontally through an intake cooling plenum chamber positioned above said stack of line cards;
      is passing said influent cooling air downwardly through an inlet side cooling plenum positioned adjacent one side of said stack of line cards;
      propelling said influent cooling air sideways, laterally and generally horizontally across said PCB-passageways between said line cards to remove and carry heat generated by said line cards;
      passing effluent heated air from said PCB-passageways positioned adjacent another side of said stack of line cards and generally opposite said inlet side cooling plenum generally upwardly through an outlet side cooling plenum;
      discharging said effluent heated air through an exhaust cooling plenum chamber positioned above said stack of line cards and separated from said intake cooling plenum chamber by a fluid-impermeable plate;
      deflecting the flow of influent cooling air with an inlet deflecting surface on one side of said fluid-impermeable plate in said intake cooling plenum chamber; and
      deflecting the flow of effluent heated air with an outlet deflection surface on an opposite side of said fluid-impermeable plate in said exhaust cooling plenum chamber.

12. An electronic communications cooling process in accordance with claim 11 wherein said air is directed, passed, propelled or discharged by at least one fan module selected from the group consisting of: a fan tray, an intake fan module, an exhaust fan module, a chassis deep fan tray, a panel fan tray, and combinations of any of the preceding.

13. An electronic communications cooling process in accordance with claim 11 wherein said air is directed, passed, propelled or discharged by at least one fan module positioned at at least one location selected from the group consisting of: said front, back, and one of said sides of said electronic communications device.

14. An electronic communications cooling process in accordance with claim 11 including positioning at least one power supply below said line cards.

15. An electronic communications cooling process in accordance with claim 11 wherein said electronics communications device is selected from the group consisting of: an electronic communication module, a rack-mounted electronic) communications device, digital television broadcast module, digital video transmitter, digital video receiver, digital video transceiver, digital video streaming device, telecommunications device, network infrastructure equipment network routers, network switches, and combinations of any of the preceding.

16. An electronic communications cooling system, comprising:

a rack-mounted electronic communications device providing an electronic communications module having a chassis comprising a frame of a housing with elongated substantially parallel longitudinal sides including a longitudinal intake side and a longitudinal outlet side and lateral substantially parallel transverse sides extending between and connecting said longitudinal sides, a top surface providing a top extending between and connected to said longitudinal sides and said lateral sides, an underside comprising a bottom surface providing a bottom positioned below and substantially parallel to said top surface and extending between and connected to said longitudinal sides and said lateral sides, a front comprising, one of said lateral sides, and a back positioned opposite of said front and comprising another of said lateral sides; said chassis containing;

at least one upright vertical stack of line cards extending longitudinally in said chassis, a card cage for receiving and holding said line cards, each of said line cards comprising a printed circuit board (PCB) with electronic circuitry and electrical components thereon, said line cards being vertically spaced from each other to form generally horizontal PCB-passageways therebetween, said electrical components and said line cards generating heat in said PCB-passageways;

an inlet upright side cooling plenum providing an upright inlet duct section positioned laterally from said line cards and pneumatically communicating with said PCB-passageways for providing an inlet cooling pathway for passing influent cooling air downwardly and to said PCB-passageways;

an outlet upright side cooling plenum providing an upright outlet duct section positioned laterally opposite of said inlet duct section and laterally from said line cards and pneumatically communicating with said PCB-passageways for providing) an outlet cooling pathway for receiving heated air from said PCB-passageways and passing the effluent heated air upwardly;

dual plenum chambers in general horizontal alignment with each other and positioned above said line cards below and in proximity to said top surface of said chassis, said dual plenum chambers being separated and partitioned by a diagonal upright vertical barrier wall providing a fluid-impervious baffle, deflector, plate and partition, said dual plenum chambers comprising an intake cooling chamber providing an inlet compartment and an exhaust cooling chamber providing an outlet compartment;

said intake cooling chamber having an intake opening and mouth providing an intake port positioned in proximity to said front of said chassis for ingress of influent ambient air and an exit opening providing an outlet port positioned in proximity to said longitudinal intake side of said chassis for egress of influent ambient air;

said barrier wall having an upright inlet deflection surface providing an intake vane facing towards said intake cooling chamber for directing and deflecting the influent ambient air from said intake port to said outlet port;

an input fan tray providing an intake fan module and assembly positioned above said line cards and pneumatically communicating with and positioned adjacent said intake cooling chamber and said inlet cooling plenum for drawing influent ambient air into said intake pun through said intake cooling chamber and injecting and propelling said influent ambient air downwardly through said inlet cooling plenum and generally horizontally through and laterally across said PCB-passageways to said outlet cooking plenum;

said exhaust cooling chamber having an inlet opening providing an inlet port positioned in proximity to said longitudinal outlet side of said chassis for ingress of is effluent heated air from said outlet cooling plenum and an exhaust opening comprising a discharge vent providing an exhaust port positioned in proximity to said back of said chassis;

said barrier wall having an upright outlet deflection surface providing an outlet vane facing towards said exhaust cooling chamber for directing and deflecting the effluent heated air from said inlet port to said exhaust port in said exhaust cooling chamber; and an output fan tray providing an exhaust fan module and assembly positioned above said line cards and pneumatically communicating with and positioned adjacent said exhaust cooling chamber and said outlet cooling plenum for drawing effluent heat air from said PCB-passageways and upwardly through said outlet cooling plenum and injecting and propelling said effluent heated air through said exhaust cooling chamber and exiting said effluent heated air through said discharge vent in proximity to said back of said chassis at a temperature greater than said ambient air.

17. An electronic communications system in accordance with claim 16 wherein said rack-mountable electronic communications device is selected from the group consisting of: a digital television broadcast module, digital video transmitter, digital video receiver digital video transceiver, digital video streaming device, telecommunications device, network infrastructure equipment, network routers network switches and combinations of any of the preceding.

18. An electronic communications system in accordance with claim 17 wherein:

said fan trays comprise longitudinally-extending chassis deep fan trays including an input chassis deep fan tray extending longitudinally along and in proximity to said longitudinal intake side and an output chassis deep fan tray extending longitudinally along and in proximity to said longitudinal outlet side;

said intake cooling chamber comprises a converging generally triangular contraction and compression intake cooling chamber converging toward said back of is said chassis;

said exhaust cooling chamber comprises a diverging generally triangular expansion exhaust cooling chamber diverging toward said back of said chassis; and said barrier wall comprises a substantially planar barrier wall extending longitudinally and diagonally connecting said front and back of said chassis.

19. An electronic communications system in accordance with claim 17 wherein:

said fan trays comprise laterally-extending panel fan trays including a front panel fan tray extending laterally along and in proximity to said front of said chassis and a back panel fan tray extending laterally along and in proximity to said back of said chassis;

said intake cooling chamber comprises a generally triangular intake cooling chamber as viewed front said top;

said exhaust cooling chamber comprises a generally triangular exhaust cooling chamber as viewed from said top; and said barrier wall comprises a substantially planar barrier will extending laterally and diagonally connecting said lateral sides.

20. An electronic communications system in accordance with claim 17 wherein:

said barrier wall comprises a backplane or a midplane;

said line cards comprise an array of different level dual-in-line cards; and power supplies are positioned below said line cards in proximity to said bottom of said chassis.

* * * * *